United States Patent
Schnell

(10) Patent No.: US 7,538,648 B2
(45) Date of Patent: May 26, 2009

(54) MRT DEVICE

(75) Inventor: Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 56 days.

(21) Appl. No.: 11/529,647

(22) Filed: Sep. 28, 2006

(65) Prior Publication Data
US 2007/0069842 A1 Mar. 29, 2007

(30) Foreign Application Priority Data
Sep. 29, 2005 (DE) .............. 10 2005 046 722

(51) Int. Cl.
*H01F 1/00* (2006.01)
*H01F 6/00* (2006.01)
(52) U.S. Cl. ............ 335/216; 324/248; 324/71.6; 361/139
(58) Field of Classification Search .......... 335/216; 324/248, 71.6
See application file for complete search history.

(56) References Cited

U.S. PATENT DOCUMENTS

| 3,296,825 | A | * | 1/1967 | Kanzig | ............... 62/51.1 |
| 3,333,218 | A | * | 7/1967 | Swartz et al. | ............... 335/216 |
| 3,359,516 | A | * | 12/1967 | Swartz et al. | ............... 335/216 |
| 3,419,794 | A | * | 12/1968 | Weaver, Jr. et al. | ......... 324/319 |
| 4,827,217 | A | * | 5/1989 | Paulson | .............. 324/248 |
| 4,986,077 | A | * | 1/1991 | Saho et al. | ................ 62/51.1 |
| 5,065,582 | A | * | 11/1991 | Seifert | ................ 62/45.1 |
| 5,144,805 | A | * | 9/1992 | Nagao et al. | ................ 62/6 |
| 5,568,110 | A |  | 10/1996 | Dorri et al. | |
| 5,680,085 | A | * | 10/1997 | Aihara et al. | ............... 335/216 |
| 6,563,312 | B2 | * | 5/2003 | Saho et al. | ................ 324/248 |
| 6,828,889 | B1 | * | 12/2004 | Zaput | .............. 335/216 |
| 7,230,426 | B2 | * | 6/2007 | Evans | .............. 324/318 |
| 2005/0046423 | A1 |  | 3/2005 | Marek | |
| 2005/0073308 | A1 |  | 4/2005 | Havens | |
| 2005/0110491 | A1 | * | 5/2005 | Havens | .............. 324/318 |

FOREIGN PATENT DOCUMENTS

DE  103 40 352 A1  4/2005
EP  0 151 719 A2  8/1985

* cited by examiner

*Primary Examiner*—Elvin G Enad
*Assistant Examiner*—Mohamad A Musleh

(57) ABSTRACT

The invention relates to an MRT device with a superconducting magnet whose coils are located in a helium tank and with electronic control components whereby a section of control components is located inside the helium tank or the helium tank has a hollow depression in its outer surface in which a section of the control components is located. The invention also relates to an MRT device with a superconducting magnet whose coils are located in a helium tank which is located in a vacuum vessel and with electronic control components whereby the helium tank has a hollow depression in its outer surface and whereby the vacuum vessel has a further hollow depression in its outer surface which is located in the area of the hollow depression in the helium tank whereby a section of the control components is located in the further hollow depression in the vacuum vessel.

4 Claims, 3 Drawing Sheets

MRT DEVICE

CROSS REFERENCE TO RELATED APPLICATIONS

This application claims priority of German application No. 10 2005 046 722.9 filed Sep. 29, 2005, which is incorporated by reference herein in its entirety.

FIELD OF THE INVENTION

The invention relates to an MRT device with a superconducting magnet whose coils are located in a helium tank, and with electronic control components.

BACKGROUND OF THE INVENTION

MRT devices have become increasingly important in the field of medical imaging in recent years. With regard to such a type of device, different magnetic fields which differ both in their strength and also in their timing and spatial characteristics and which are very precisely coordinated with one another are normally applied in order to produce the image.

One of these magnetic fields is a static basic magnetic field which is normally generated by a superconducting magnet and the magnetic field has a strength of normally 0.2 to 3 Tesla and greater. The so-called primary coils of the superconducting magnet are normally housed in a hollow cylindrical shaped helium tank cooled with liquid helium and principally generate the basic magnetic field. In addition to the desired basic magnetic field generated in the center of the hollow cylindrical shaped helium tank, the primary coils generate an intense undesired stray field which would surround the MRT system and which as a result of its strength would be a potential source of danger. In order to reduce the stray field, superconducting screening coils counterwound around the primary coils generating the field which first and foremost largely compensate for the stray field are normally fitted in the cylindrical helium tank.

A further type of magnetic field which is required for producing an image comprises time-varying gradient magnetic fields which normally have a maximum field strength of about 50 mTesla and are switched at frequencies of 0 to 5 KHz. Furthermore, high-frequency magnetic fields (HF magnetic fields) whose frequency and spatial orientation are coordinated with the magnetic field strength of the static magnetic field, and whose frequencies typically lie in a frequency range of 8 to 125 MHz, are applied as excitation pulses for spins.

All the aforementioned magnetic fields must be coordinated with one another very precisely during the imaging process in respect of their strength and in their timing sequence. To the end and in order to control further mechanical and electronic components of an MRT system electronic control components are required which must be accommodated in the vicinity of the magnets generating the fields.

In order that the sensitive electronic control components are not influenced by the applied magnetic fields and in order that the fields emitted by the electronic control components do not for their part adversely affect the highly sensitive magnetic fields, they must be specifically screened. US 2005/0073308 A1 describes a housing developed specifically for the control components with a radio frequency screening facility. Such a type of housing occupies space, for which reason the entire MRT system must have more generous dimensions.

Furthermore, separate provision must be made for cooling the control components in addition to cooling the superconducting magnet.

DE 103 40 352 A1 discloses a cryo head for core spin resonance measurements, into which a sample to be measured is introduced, whereby the cryo head has amongst other things a heat exchanger which can be cooled by means of a fluid flowing through it, helium in particular. By this means, HF coils or resonators which are likewise located on the cryo head can also be cooled to cryogenic temperatures. In particular, a preamplifier which can likewise be cooled is located in the cryo head. Such a cryo head is introduced into a strong stationary magnetic field of a superconducting magnet in order to perform the measurement.

A magnet system for a core-spin tomography device with a helium cooled coil wound from superconducting conductors is described in EP 0 151 719 A2. The magnet system has an iron screening facility, indirect cooling and a flow pump for power supply which is situated inside the vacuum vessel, between the magnet coils.

A closed MRI magnet having a pair of superconducting primary coils and a pair of compensation coils lying between the primary coils is known from U.S. Pat. No. 5,568,110 A. The compensation coils have a smaller radius than the primary coils. In one embodiment, the examination opening has a radius which becomes greater starting from the compensation coils along the axis of rotation towards the outside; a recess is situated between the compensation coils.

SUMMARY OF THE INVENTION

The object of the present invention to provide an MRT device having a space-saving arrangement of the control components, whereby in addition a cooling of the control components can be implemented in a simple manner.

The object is achieved according to the invention by an MRT device according to the claims.

Further advantageous embodiments of the invention are each set down in subordinate claims.

The inventive MRT device according to the first independent claim comprises a superconducting magnet, whose coils are located in a helium tank, and electronic control components, whereby at least one section of the control components is located inside the helium tank.

Since the helium tank of a superconducting magnet normally takes the form of a metal vessel in the case of an MRT device, the HF screening of the control components is provided by an arrangement of the control components in the helium tank. The cooling of the coils by means of liquid helium can now similarly be utilized for the cooling of the control components. In addition, the control components are now situated in the spatial vicinity of the elements of the MRT system which are controlled by them, such that long screened feed lines can be of a considerably shorter and more cost-effective form.

Normally the superconducting coils, which are located in the helium tank in the case of an MRT device, comprise both primary coils and also screening coils. Both coil types together generate the basic magnetic field which generates a strong and in good approximation homogeneous magnetic field in the imaging volume of the MRT device, and which rapidly decreases outside the MRT device. In this situation, the primary coils are normally situated on the inner wall of the helium tank and are arranged more densely than the screening coils which are situated around the primary coils. There is thus sufficient space between the screening coils in which the control components are located in a preferred embodiment of the MRT device.

In a further embodiment, the control components are situated in the space which is delimited inwards by the primary coils, outwards by the outer wall of the helium tank and sideways by the screening coils.

In an advantageous embodiment of the invention, the section of the control components which is located in the helium tank includes the control components for the gradient coils. As a result of the spatial proximity of the control components to the coils, the feed lines can be designed to be significantly shorter than if the control components are accommodated in a separate housing beside the MRT device.

In another advantageous embodiment of the invention, the section of the control components includes the control components for the HF coils, such as the HF amplifiers, here in particular the low-noise HF preamplifiers. As a result of the fact that the HF amplifiers are screened and intensely cooled, high-quality results can be achieved with the amplification.

The inventive MRT device according to the second independent claim comprises a superconducting magnet whose coils are located in a helium tank, and electronic control components, whereby the helium tank has at least one hollow depression in its outer surface, in which at least one section of the control components is located. In this situation, the hollow depression is formed in the free space between the screening coils. In addition, the control components are now situated in the spatial vicinity of the elements of the MRT system, such that long screened feed lines can be of a considerably shorter and more cost-effective form.

As a result of the fact that the helium tank is normally situated inside a vacuum vessel, the control components are also situated inside the vacuum vessel. Since the vacuum vessel normally takes the form of a metal vessel, the arrangement of the control components outside the helium tank and inside the vacuum vessel means that HF screening of the control components is provided in a simple manner.

In addition to the helium tank, the vacuum vessel normally contains at least one cold shield. In one variant, the control components which are located in the hollow depression are located between the outer surface of the helium tank and the cold shield. Since the cold shield normally takes the form of a 77K cold shield which is actively cooled, the control components are preferably connected to the cold shield. By this means, the waste heat from the control components can be taken away in a simple manner.

In this case too the control components preferably include control components for the gradient coils and/or for the HF coils, in particular their HF amplifiers.

The inventive MRT device according to the third independent claim comprises a superconducting magnet whose coils are located in a helium tank which is located in a vacuum vessel, and electronic control components, whereby the helium tank has at least one hollow depression on its outer surface, and whereby the vacuum vessel has at least one further hollow depression on its outer surface which is located in the area of the hollow depression in the helium tank, whereby at least one section of the control components is located in the further hollow depression in the vacuum vessel. In this situation, the hollow depressions are located in the free space between the screening coils. The fact that the control components are situated only outside the vacuum vessel provides for simple maintenance of the control components. The vacuum vessel simultaneously serves as a heat sink for the control components.

In a preferred embodiment of the invention, an HF screen is fitted above the hollow depression in the vacuum vessel in order to screen the control components from all sides against disruptive HF radiation. In a simple embodiment, the HF screen can take the form of a metallic cover, made for example of stainless steel, aluminum, copper or even of metallized plastic sheet.

Here too the control components preferably include control components for the gradient coils and/or for the HF coils.

BRIEF DESCRIPTION OF THE DRAWINGS

The invention and also further advantageous embodiments according to the features set down in the subclaims will be described in detail in the following with reference to schematically illustrated examples in the drawing, without however being restricted to these. In the drawings:

DETAILED DESCRIPTION OF THE INVENTION

Figure 1:
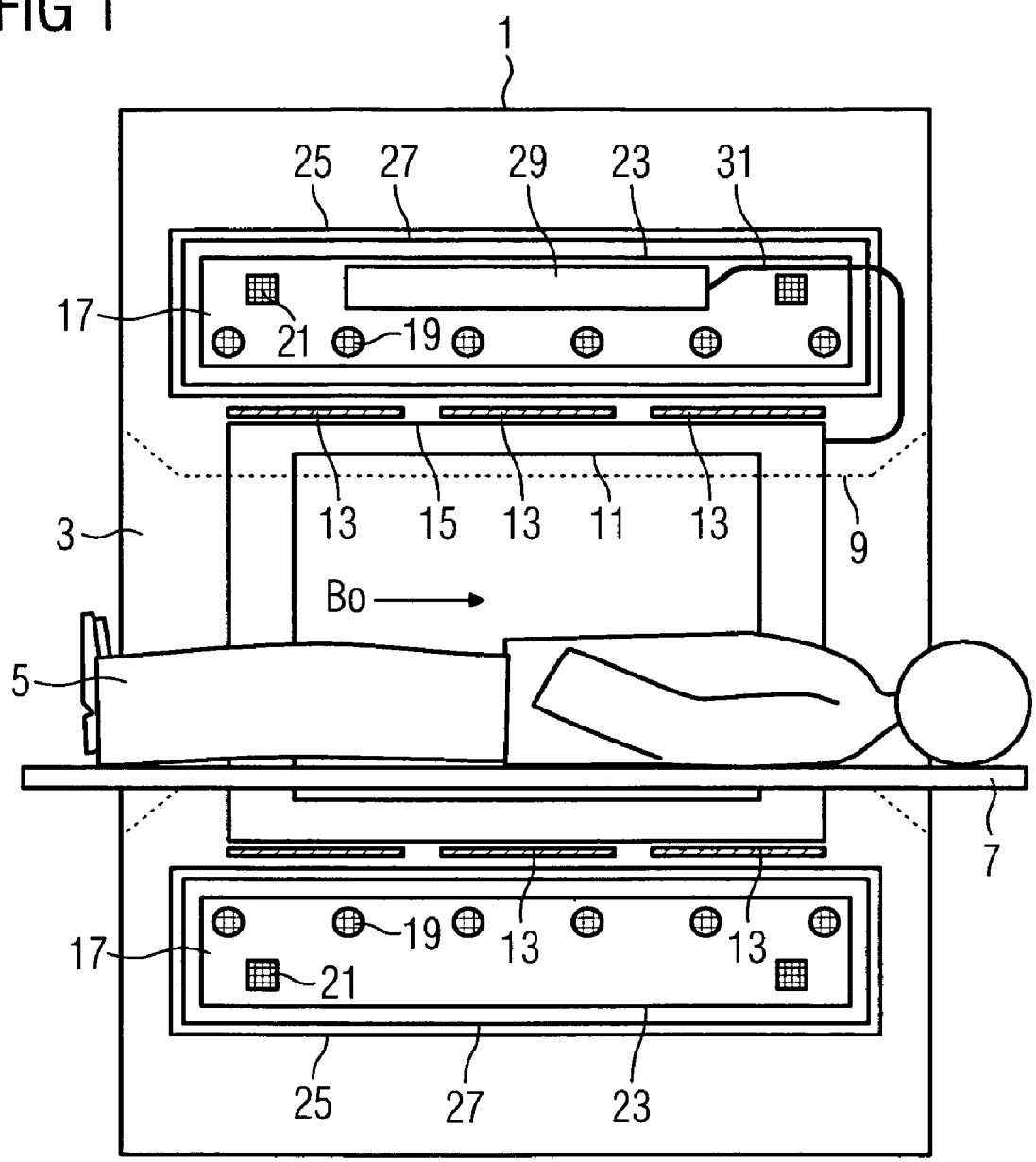
FIG. 1 shows a schematic longitudinal section through an MRT device, in which one section of the control components is located in a helium-cooled helium tank.

FIG. 1 shows a schematic representation of a longitudinal section through an MRT device 1. A patient 5 on a patient table 7 is situated in the tunnel-shaped opening 3. Behind the cover 9 of the tunnel-shaped opening 3 are located different coils which generate the magnetic fields required for imaging purposes.

An HF coil 11 takes the form in the example shown here of a body coil. This serves to send HF excitation pulses or to detect the rotating transverse magnetization of the core spins. It is normally situated behind the cover 9 in close proximity to the patient 5. Located around the body coil are the gradient coils 15 for generating the gradient fields. Between the gradient coils 15 and the superconducting magnet 17 are situated means 13 for shimming the basic magnetic field $B_0$.

The basic magnetic field $B_0$ is generated by a superconducting magnet 17. For this purpose, superconducting coils 19, 21 are situated in a helium tank 23 filled with liquid helium. They are normally located on coil carriers not shown in FIG. 1. In order to minimize any warming of the liquid helium through heat convection, the helium tank 23 is situated in a vacuum vessel 25 and is additionally protected by cold shields 27.

In the embodiment of the invention represented here electronic control components 29, which here take the form of control components for the gradient coils 15, are located inside the helium tank 23. In this situation, the space in which the electronic control components 29 are located is delimited inwards by the primary coils 19, outwards by the outer wall of the helium tank 23 and sideways by the two screening coils 21. As a result of the fact that the control components 29 are situated in a metallic helium tank 23, they are screened against any disruption by electromagnetic radiation. The liquid helium responsible for cooling the coils 19, 21 also provides cooling for the control components 29.

The control components 29 are provided with a feed line 31 which enables the power supply for, and connection of the control components 29 to, further elements—here to the gradient coils 15—of the MRT device 1.

Figure 2:
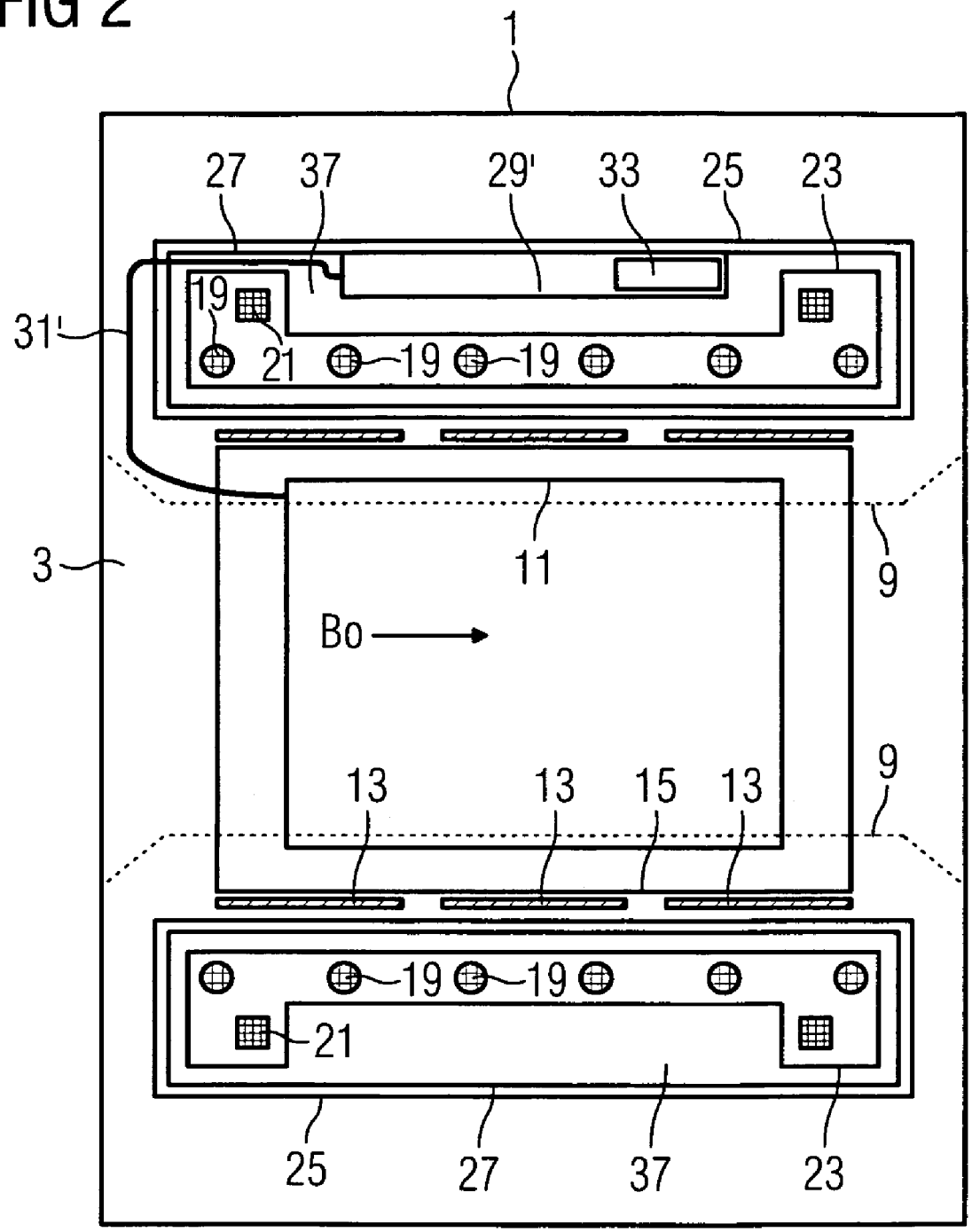
FIG. 2 shows a schematic longitudinal section through an MRT device, in which one section of the control components is located in a hollow depression in the helium tank.

FIG. 2 shows a further embodiment of the invention. In this case, the helium tank 23 is equipped with a hollow depression 37 on its outer wall surface. In this situation, the hollow depression 37 reduces the unused space in the helium tank 23 between the screening coils 21. In this manner, space in which control components 29' can now be fitted is gained outside the helium tank 23.

With regard to the control components 29' shown here, these include an HF amplifier 33 and are connected by way of feed lines 31' to the HF coils 11. The HF amplifier 33 can for example be a low-noise preamplifier for the HF coil 11. As a result of the fact that the HF amplifier 33 is situated in a cold environment and is in addition screened against HF radiation by the vacuum vessel 25, a high quality of amplification can be guaranteed.

Since the HF amplifier 33 is situated between the cold shields 27 and the helium tank 23, the cooling of the HF amplifier 33 can be maintained in a simple manner by for example connecting the HF amplifier 33—as shown here—to one of the cold shields 27, preferably to the actively cooled 77K cold shield. It is however also possible to connect the control components 29' to the wall of the helium tank 23 for cooling purposes.

Since the control components 29' with the HF amplifier 33 are situated inside the normally metal vacuum vessel 25, the HF screening of the control components is automatically maintained by this arrangement.

Figure 3:
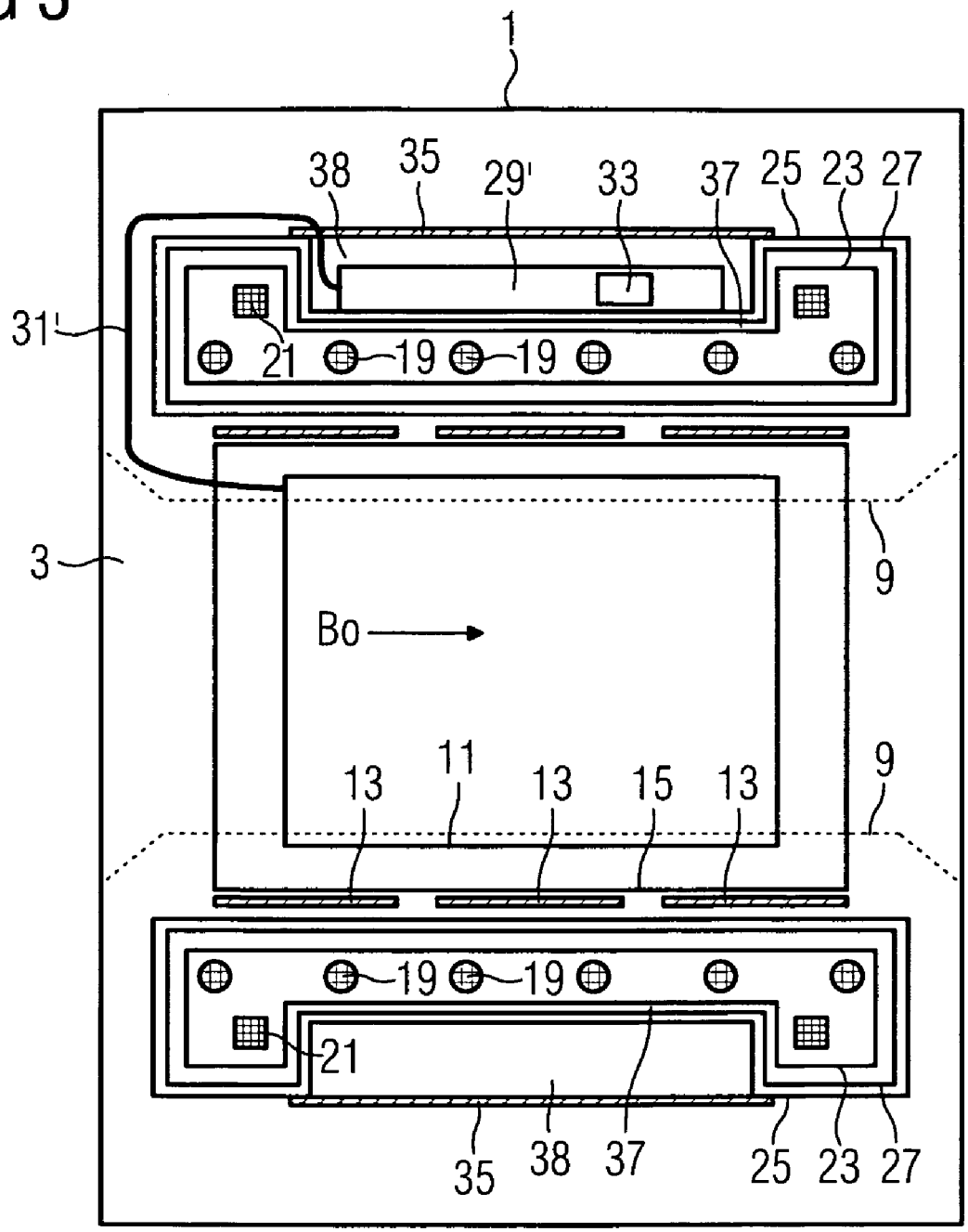
FIG. 3 shows a schematic longitudinal section through an MRT device, in which one section of the control components is located in a hollow depression in the vacuum vessel.

FIG. 3 shows a further embodiment of the invention. The vacuum vessel 25 and the helium tank 23 each have a hollow depression 38, 37 on their outer wall surfaces. In this situation, the hollow depressions 37, 38 reduce the unused space in the helium tank 23 between the screening coils 21. The cold shields 27 are shaped accordingly. In this manner, space in which control components 29' can now be fitted is gained outside the vacuum vessel 25. Since the control components 29' are located on the wall of the vacuum vessel 25, the wall serves as a heat sink for the control components 29'. The fact that the control components 29' are situated outside the vacuum vessel 25 also provides for simple maintenance of the control components 29'.

In order that the control components 29' and in particular the HF amplifier 33 are screened against disruptive radiation, an HF screen 35, for example a metallic cover, is fitted around the hollow depression 38 of the vacuum vessel 25. By this means the control components 29' are screened towards all sides. The hollow depressions 37, 38 in the vacuum vessel 25 and the helium tank 23 and the HF screen 35 do not necessarily—as illustrated here—need to run axially symmetrically around the entire circumference of the vacuum vessel 25. The depressions 37, 38 can also be fitted only in one partial segment of the outer wall of the vacuum vessel 25 and of the helium tank 23. In this case the HF screen 35 does not need to be fitted around the entire circumference of the vacuum vessel 25 but simply above the depression 38 in the vacuum vessel 25.

The invention claimed is:

1. A magnetic resonance device, comprising:
    a helium tank arranged in the magnetic resonance device;
    a superconducting magnet comprising both primary coils and screening coils located in the helium tank that generate a basic magnetic field which generates a strong and in good approximation homogeneous magnetic field in an imaging volume of the magnetic resonance device by both the primary coils and the screening coils together; and
    an electronic control component wherein a section of the electronic control component is located in a space delimited inwards by the primary coils, outwards by an outer wall of the helium tank and sideways by the screening coils.

2. The magnetic resonance device as claimed in claim 1, wherein the section of the electronic control component located in the helium tank comprises a control component for gradient coils of the magnetic resonance device.

3. The magnetic resonance device as claimed in claim 1, wherein the section of the electronic control component located in the helium tank comprises a control component for high frequency coils of the magnetic resonance device.

4. The magnetic resonance device as claimed in claim 3, wherein the control component for high frequency coils is a high frequency amplifier.

\* \* \* \* \*